(12) United States Patent
Streefkerk et al.

(10) Patent No.: US 10,451,973 B2
(45) Date of Patent: Oct. 22, 2019

(54) LITHOGRAPHIC APPARATUS AND DEVICE MANUFACTURING METHOD

(71) Applicant: ASML NETHERLANDS B.V., Veldhoven (NL)

(72) Inventors: Bob Streefkerk, Tilburg (NL); Sjoerd Nicolaas Lambertus Donders, 's-Hertogenbosch (NL); Roelof Frederik De Graaf, Veldhoven (NL); Christiaan Alexander Hoogendam, Veldhoven (NL); Hans Jansen, Eindhoven (NL); Martinus Hendrikus Antonius Leenders, Rotterdam (NL); Paulus Martinus Maria Liebregts, Veldhoven (NL); Jeroen Johannes Sophia Maria Mertens, Duizel (NL); Jan-Gerard Cornelis Van Der Toorn, Eindhoven (NL); Michel Riepen, Bergschenhoek (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/871,795

(22) Filed: Sep. 30, 2015

(65) Prior Publication Data

US 2016/0026085 A1 Jan. 28, 2016

Related U.S. Application Data

(63) Continuation of application No. 14/484,076, filed on Sep. 11, 2014, which is a continuation of application
(Continued)

(51) Int. Cl.
*G02B 27/52* (2006.01)
*G03F 7/20* (2006.01)
(Continued)

(52) U.S. Cl.
CPC .......... *G03F 7/2041* (2013.01); *G03F 7/3085* (2013.01); *G03F 7/70058* (2013.01);
(Continued)

(58) Field of Classification Search
CPC ..................... G03F 7/70341; G03F 7/70358
(Continued)

(56) References Cited

U.S. PATENT DOCUMENTS 1,954,755 A 4/1934 Heine
3,573,975 A 4/1971 Dhaka et al.
(Continued)

FOREIGN PATENT DOCUMENTS

DE 206 607 2/1984
DE 221 563 4/1985
(Continued)

OTHER PUBLICATIONS

U.S. Office Action dated Feb. 9, 2016 in corresponding U.S. Appl. No. 14/484,076.
(Continued)

*Primary Examiner* — Hung Nguyen
(74) *Attorney, Agent, or Firm* — Pillsbury Winthrop Shaw Pittman LLP

(57) ABSTRACT

An immersion lithographic apparatus is provided with a liquid confinement structure which defines at least in part a space configured to contain liquid between the projection system and the substrate. In order to reduce the crossing of the edge of the substrate which is being imaged (which can lead to inclusion of bubbles in the immersion liquid), the cross-sectional area of the space in a plane parallel to the substrate is made as small as possible. The smallest theoretical size is the size of the target portion which is imaged by the projection system. In an embodiment, the shape of a final element of the projection system is also changed to
(Continued)

have a similar size and/or shape in a cross-section parallel to the substrate to that of the target portion.

74 Claims, 6 Drawing Sheets

Related U.S. Application Data

No. 13/589,841, filed on Aug. 20, 2012, now Pat. No. 8,860,924, which is a continuation of application No. 11/120,186, filed on May 3, 2005, now Pat. No. 8,248,577.

(51) Int. Cl.
  *G03F 7/30* (2006.01)
  *H01L 21/027* (2006.01)
  *H01L 21/67* (2006.01)

(52) U.S. Cl.
  CPC ...... *G03F 7/70341* (2013.01); *G03F 7/70825* (2013.01); *G03F 7/70875* (2013.01); *G03F 7/70916* (2013.01); *H01L 21/0274* (2013.01); *H01L 21/67098* (2013.01); *G03F 2007/2067* (2013.01)

(58) Field of Classification Search
  USPC .............................................. 355/30, 53, 67
  See application file for complete search history.

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,405,701 A | 9/1983 | Banks et al. |
| 4,480,910 A | 11/1984 | Takanashi et al. |
| 4,509,852 A | 4/1985 | Tabarelli et al. |
| 4,624,555 A | 11/1986 | Tokuhara et al. |
| 4,747,678 A | 5/1988 | Shafer et al. |
| 4,953,960 A | 9/1990 | Williamson |
| 5,040,020 A | 8/1991 | Rauschenbach et al. |
| 5,121,256 A | 6/1992 | Corie et al. |
| 5,212,593 A | 5/1993 | Williamson et al. |
| 5,298,939 A | 3/1994 | Swanson et al. |
| 5,537,260 A | 7/1996 | Williamson |
| 5,610,683 A | 3/1997 | Takahashi |
| 5,699,197 A | 12/1997 | Otaki |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,407,884 B1 | 6/2002 | Osborne et al. |
| 6,473,243 B1 | 10/2002 | Omura |
| 6,486,940 B1 | 11/2002 | Williamson |
| 6,600,547 B2 | 7/2003 | Watson et al. |
| 6,603,130 B1 | 8/2003 | Bisschops et al. |
| 6,671,246 B1 | 12/2003 | Matsuo |
| 6,878,916 B2 | 4/2005 | Schuster |
| 6,909,492 B2 | 6/2005 | Omura |
| 6,952,253 B2 | 10/2005 | Lof et al. |
| 7,075,616 B2 | 7/2006 | Derksen et al. |
| 7,088,422 B2 | 8/2006 | Hakey et al. |
| 7,088,433 B1 | 8/2006 | Kato |
| 7,184,122 B2 | 2/2007 | Sengers et al. |
| 7,215,410 B2 | 5/2007 | Sumiyoshi |
| 7,256,868 B2 | 8/2007 | Akamatsu |
| 7,292,316 B2 | 11/2007 | Kohno |
| 7,324,185 B2 * | 1/2008 | Mulkens ............ G03F 7/70058 355/30 |
| 7,352,434 B2 | 4/2008 | Streefkerk et al. |
| 7,362,508 B2 | 4/2008 | Omura et al. |
| 7,369,217 B2 | 5/2008 | Carroll |
| 7,411,653 B2 | 8/2008 | Hoogendam et al. |
| 7,411,654 B2 | 8/2008 | Beckers et al. |
| 7,433,019 B2 | 10/2008 | Kiuchi et al. |
| 7,528,929 B2 | 5/2009 | Streefkerk et al. |
| 7,697,111 B2 | 4/2010 | Shirai et al. |
| 7,800,422 B2 | 9/2010 | Lee et al. |
| 7,843,551 B2 | 11/2010 | Mulkens et al. |
| 7,852,456 B2 | 12/2010 | Nagasaka |
| 7,993,008 B2 | 8/2011 | Shirai et al. |
| 8,149,381 B2 | 4/2012 | Shirai et al. |
| 8,189,170 B2 | 5/2012 | Shirai et al. |
| 8,248,577 B2 | 8/2012 | Streefkerk et al. |
| 8,514,369 B2 | 8/2013 | Mulkens et al. |
| 8,854,601 B2 | 10/2014 | Omura et al. |
| 2001/0012101 A1 | 8/2001 | Mulkens |
| 2001/0033437 A1 | 10/2001 | Meehan et al. |
| 2002/0011298 A1 | 1/2002 | Jain et al. |
| 2002/0020821 A1 | 2/2002 | Van Santen et al. |
| 2002/0027718 A1 | 3/2002 | Kreuzer |
| 2002/0027719 A1 | 3/2002 | Kreuzer |
| 2002/0027863 A1 | 3/2002 | Kikuchi et al. |
| 2002/0089734 A1 | 7/2002 | Meehan et al. |
| 2002/0089758 A1 | 7/2002 | Hori |
| 2002/0163629 A1 | 11/2002 | Switkes et al. |
| 2003/0011755 A1 | 1/2003 | Omura et al. |
| 2003/0123040 A1 | 7/2003 | Almogy |
| 2003/0189696 A1 | 10/2003 | Sumiyoshi et al. |
| 2004/0000627 A1 | 1/2004 | Schuster |
| 2004/0075895 A1 | 4/2004 | Lin |
| 2004/0114117 A1 | 6/2004 | Bleeker |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1 | 10/2004 | Lof et al. |
| 2004/0211920 A1 | 10/2004 | Derksen et al. |
| 2004/0239954 A1 | 12/2004 | Bischoff |
| 2004/0257544 A1 | 12/2004 | Vogel et al. |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024009 A1 | 2/2005 | De Smit et al. |
| 2005/0030497 A1 | 2/2005 | Nakamura |
| 2005/0041225 A1 | 2/2005 | Sengers et al. |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0068639 A1 | 3/2005 | Pierrat et al. |
| 2005/0078286 A1 | 4/2005 | Dierichs et al. |
| 2005/0078287 A1 | 4/2005 | Sengers et al. |
| 2005/0088635 A1 | 4/2005 | Hoogendam et al. |
| 2005/0094116 A1 | 5/2005 | Flagello et al. |
| 2005/0094125 A1 | 5/2005 | Arai |
| 2005/0122505 A1 | 6/2005 | Miyajima |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0145803 A1 | 7/2005 | Hakey et al. |
| 2005/0146693 A1 | 7/2005 | Ohsaki |
| 2005/0146694 A1 | 7/2005 | Tokita |
| 2005/0151942 A1 | 7/2005 | Kawashima |
| 2005/0179877 A1 | 8/2005 | Mulkens et al. |
| 2005/0200815 A1 | 9/2005 | Akamatsu |
| 2005/0213065 A1 | 9/2005 | Kitaoka |
| 2005/0213066 A1 * | 9/2005 | Sumiyoshi .......... G03F 7/70233 355/53 |
| 2005/0219489 A1 | 10/2005 | Nei et al. |
| 2005/0232120 A1 | 10/2005 | Shinoda |
| 2005/0233081 A1 | 10/2005 | Tokita |
| 2005/0237502 A1 | 10/2005 | Kawashima |
| 2006/0077788 A1 | 4/2006 | Shinoda |
| 2006/0077789 A1 | 4/2006 | Shinoda et al. |
| 2006/0103821 A1 | 5/2006 | Hendricus et al. |
| 2006/0139583 A1 | 6/2006 | Wegmann et al. |
| 2006/0176461 A1 | 8/2006 | Sekine |
| 2006/0197927 A1 | 9/2006 | Mulkens et al. |
| 2006/0232756 A1 | 10/2006 | Lof et al. |
| 2006/0244938 A1 | 11/2006 | Schuster |

(56) References Cited

U.S. PATENT DOCUMENTS

| | | |
|---|---|---|
| 2007/0201012 A1 | 8/2007 | Loopstra et al. |
| 2007/0285633 A1 | 12/2007 | Ikezawa et al. |
| 2007/0285637 A1 | 12/2007 | Dorsel et al. |
| 2008/0018866 A1 | 1/2008 | Nagasaka et al. |
| 2009/0002660 A1 | 1/2009 | Kiuchi |
| 2009/0046268 A1 | 2/2009 | Omura et al. |
| 2011/0051112 A1 | 3/2011 | Nagasaka |
| 2013/0194560 A1 | 8/2013 | Omura et al. |
| 2015/0029476 A1 | 1/2015 | Omura et al. |
| 2015/0029482 A1 | 1/2015 | Omura et al. |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 0764858 | 3/1997 |
| EP | 1 039 458 | 9/2000 |
| EP | 1039511 | 9/2000 |
| EP | 1 098 215 | 5/2001 |
| EP | 1280007 | 1/2003 |
| EP | 1 420 298 | 5/2004 |
| EP | 1 420 300 | 5/2004 |
| EP | 1 477 856 | 11/2004 |
| EP | 1480065 | 11/2004 |
| EP | 1 494 079 | 1/2005 |
| EP | 1 519 230 | 3/2005 |
| EP | 1 524 558 | 4/2005 |
| EP | 1 646 074 | 4/2006 |
| EP | 1 670 038 | 6/2006 |
| EP | 1881521 | 1/2008 |
| FR | 2474708 | 7/1981 |
| GB | 669921 | 4/1952 |
| JP | 58-202448 | 11/1983 |
| JP | S59-19912 | 2/1984 |
| JP | 62-065326 | 3/1987 |
| JP | 62-121417 | 6/1987 |
| JP | 63-157419 | 6/1988 |
| JP | H04130710 | 5/1992 |
| JP | H04133414 | 5/1992 |
| JP | H04211110 | 8/1992 |
| JP | H04273245 | 9/1992 |
| JP | 04-305915 | 10/1992 |
| JP | 04-305917 | 10/1992 |
| JP | H0545886 | 2/1993 |
| JP | 06-124873 | 5/1994 |
| JP | 07-132262 | 5/1995 |
| JP | H07122469 | 5/1995 |
| JP | H07135165 | 5/1995 |
| JP | 07-220990 | 8/1995 |
| JP | H08334695 | 12/1996 |
| JP | H0982626 | 3/1997 |
| JP | H103039 | 1/1998 |
| JP | H1020195 | 1/1998 |
| JP | 10-228661 | 8/1998 |
| JP | 10-255319 | 9/1998 |
| JP | 10-303114 | 11/1998 |
| JP | 10-340846 | 12/1998 |
| JP | H11162831 | 6/1999 |
| JP | 11-176727 | 7/1999 |
| JP | H11283903 | 10/1999 |
| JP | 2000003874 | 1/2000 |
| JP | 2000012453 | 1/2000 |
| JP | 2000-058436 | 2/2000 |
| JP | 2000114157 | 4/2000 |
| JP | 2001-091849 | 4/2001 |
| JP | 2001110707 | 4/2001 |
| JP | 2001228401 | 8/2001 |
| JP | 2001307982 | 11/2001 |
| JP | 2002093690 | 3/2002 |
| JP | 2002100561 | 4/2002 |
| JP | 2002118058 | 4/2002 |
| JP | 2002236242 | 8/2002 |
| JP | 2002/277742 | 9/2002 |
| JP | 2002/323658 | 11/2002 |
| JP | 2002373849 | 12/2002 |
| JP | 2003/059803 | 2/2003 |
| JP | 2003/059821 | 2/2003 |
| JP | 2003307679 | 10/2003 |
| JP | 2004145269 | 5/2004 |
| JP | 2004-193252 | 7/2004 |
| JP | 2004/205698 | 7/2004 |
| JP | 2004/207711 | 7/2004 |
| JP | 2004/228497 | 8/2004 |
| JP | 2004/259966 | 9/2004 |
| JP | 2004-289128 | 10/2004 |
| JP | 2004/303808 | 10/2004 |
| JP | 2004-333761 | 11/2004 |
| JP | 2004-356205 | 12/2004 |
| JP | 2005/019864 | 1/2005 |
| JP | 2005-045265 | 2/2005 |
| JP | 2005/086148 | 3/2005 |
| JP | 2005-093997 | 4/2005 |
| JP | 2005/116570 | 4/2005 |
| JP | 2005115127 | 4/2005 |
| JP | 2005136404 | 5/2005 |
| JP | 2005-167211 | 6/2005 |
| JP | 2005175176 | 6/2005 |
| JP | 2005/233979 | 9/2005 |
| JP | 2005/268741 | 9/2005 |
| JP | 2005257740 | 9/2005 |
| JP | 2005268700 | 9/2005 |
| JP | 2005303167 | 10/2005 |
| JP | 2005536775 | 12/2005 |
| JP | 2006024706 | 1/2006 |
| JP | 2006024819 | 1/2006 |
| JP | 2006032750 | 2/2006 |
| JP | 2006128192 | 5/2006 |
| JP | 2006-140459 | 6/2006 |
| JP | 2006222222 | 8/2006 |
| JP | 2007-019463 | 1/2007 |
| JP | 2007005830 | 1/2007 |
| JP | 2007507881 | 3/2007 |
| WO | 99/27568 | 6/1999 |
| WO | WO 99/49504 | 9/1999 |
| WO | 01/65296 | 9/2001 |
| WO | 200213194 | 2/2002 |
| WO | 03/077036 | 9/2003 |
| WO | 03/085708 | 10/2003 |
| WO | 2004/019128 | 3/2004 |
| WO | 2004/053596 | 6/2004 |
| WO | 2004/053950 | 6/2004 |
| WO | 2004/053951 | 6/2004 |
| WO | 2004/053952 | 6/2004 |
| WO | 2004/053953 | 6/2004 |
| WO | 2004/053954 | 6/2004 |
| WO | 2004/053955 | 6/2004 |
| WO | 2004/053956 | 6/2004 |
| WO | 2004/053957 | 6/2004 |
| WO | 2004/053958 | 6/2004 |
| WO | 2004/053959 | 6/2004 |
| WO | 2004053534 | 6/2004 |
| WO | 2004/055803 | 7/2004 |
| WO | 2004/057589 | 7/2004 |
| WO | 2004/057590 | 7/2004 |
| WO | 2004/086468 | 10/2004 |
| WO | 2004/086470 | 10/2004 |
| WO | 2004/090577 | 10/2004 |
| WO | 2004/090633 | 10/2004 |
| WO | 2004/090634 | 10/2004 |
| WO | 2004/090956 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004088650 | 10/2004 |
| WO | 2004/095135 | 11/2004 |
| WO | 2004097911 | 11/2004 |
| WO | 2004/105106 | 12/2004 |
| WO | 2004/105107 | 12/2004 |
| WO | 2004/107048 | 12/2004 |
| WO | 2004/107417 | 12/2004 |

(56) References Cited

FOREIGN PATENT DOCUMENTS

| WO | 2004/114380 | 12/2004 |
|---|---|---|
| WO | 2004107011 | 12/2004 |
| WO | 2005/006415 | 1/2005 |
| WO | 2005/006417 | 1/2005 |
| WO | 2005/006418 | 1/2005 |
| WO | 2004/010611 | 2/2005 |
| WO | 2005/020298 | 3/2005 |
| WO | 2005/022615 | 3/2005 |
| WO | 2005/024517 | 3/2005 |
| WO | 2005/029559 | 3/2005 |
| WO | 2005/034174 | 4/2005 |
| WO | 2005/041276 | 5/2005 |
| WO | 2005/067013 | 7/2005 |
| WO | 2005101121 | 10/2005 |
| WO | 2005/104195 | 11/2005 |
| WO | 2006/018972 | 2/2006 |
| WO | 2006/025341 | 3/2006 |
| WO | 2006/043457 | 4/2006 |
| WO | 2006/121009 | 11/2006 |
| WO | 2007/055373 | 5/2007 |
| WO | 2007/132862 | 11/2007 |
| WO | 2008/031576 | 3/2008 |

OTHER PUBLICATIONS

U.S. Office Action dated Feb. 25, 2016 in corresponding U.S. Appl. No. 13/951,222.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci, Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0.2µm Fine Patterns Using Optical Projection Lithography with an Oil Immersion Lens", Jpn. J. Appl. Phys. vol. 31 (1992), pp. 4174-4177.
G. Owen et al., "1/8µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003.
S. Owa et al., "Update on 193nm immersion exposure tool", Litho Forum, International SEMATECH, Los Angeles, Jan. 27-29, 2004.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
European Office Action for European Applicatin No. 07 013 766.6 dated Apr. 23, 2009.
European Search Report issued for European Patent Application No. 06252237.0-2222, dated Apr. 17, 2007.
Notice of Reasons for Rejection for Japanese Patent Application No. 2006-123549 dated Jul. 22, 2009.
Chinese Office Action for Chinese Application No. 200810095615.1 dated Aug. 28, 2009.
Japanese Office Action dated Apr. 6, 2012 in corresponding Japanese Patent Application No. 2009-243837.
European Office Action dated Mar. 15, 2013 in corresponding European Patent Application No. 07 013 766.6.
Taiwan Office Action dated Jun. 25, 2013 in corresponding Taiwan Patent Application No. 099129747.
U.S. Office Action dated Oct. 8, 2015 in corresponding U.S. Appl. No. 13/951,222.
Carl Zeiss SMT GmbH v. Nikon Corporation, Invalidity Action relating to European Patent No. 1 881 521, (Aug. 16, 2017), 68 pages.
Non-Final Office Action dated Oct. 11, 2017 in corresponding U.S. Appl. No. 15/482,587.
Statement of Defence by Carl Zeiss dated Aug. 15, 2017 in *Nikon Corporation* vs. *Carl Zeiss SMT GmbH*, Mannheim Regional Court, 7$^{th}$ Civil Chamber, (69 pages).
Surrejoinder by Nikon dated Apr. 19, 2018 in *Nikon Corporation* vs. *Carl Zeiss SMT GmbH*, Mannheim Regional Court, 7$^{th}$ Civil Chamber, (27 pages).
Rebutter by Carl Zeiss dated Jun. 22, 2018 in *Nikon Corporation* vs. *Carl Zeiss SMT GmbH*, Mannheim Regional Court, 7$^{th}$ Civil Chamber, (63 pages).
Fifth Rejoinder by Nikon dated Jun. 22, 2018 in *Nikon Corporation* vs. *Carl Zeiss SMT GmbH*, Mannheim Regional Court, 7$^{th}$ Civil Chamber, (32 pages).
Owa et al., "Nikon Immersion Exposure Tool Development," International Symposium on Immersion and 157nm Lithography, SEMATECH, Vancouver, B.C., Canada (Aug. 2004).
Owa et al., "Feasibility of Immersion Lithography," Proc. of SPIE, vol. 5377, pp. 264-272 (May 2004).
Lin et al., "Immersion Lithography and Its Impact on Semiconductor Manufacturing," Proc. of SPIE, vol. 5377, pp. 46-67 (May 2004).
Van Den Hove et al., "Lithography for sub-90nm Applications," International Electron Devices Meeting (IEDM), pp. 3-8 (2002).
Kameyama et al., "Extension of Photolithography," Proc. of SPIE, vol. 5446, pp. 451-461 (Aug. 2004).
Ulrich et al., "The Development of Dioptric Projection Lenses for DUV Lithography," Proc. of SPIE, vol. 4832, pp. 158-169 (2002).
Nataraj et al., "Liquid Immersion Lens Technology Applied to Laser Voltage Probing of 130nm Process Technology Devices," Journal of Vacuum Science and Technology, Technology B, vol. 20, No. 6, pp. 3067-3070 (Nov./Dec. 2002).
Ohmura et al., "Catadioptric Lens Development for DUV and VUV Projection Optics," Proc. of SPIE, vol., 5040, pp. 781-788 (2003).
Feldmann et al., "Catadioptric Projection Lenses for Immersion Lithography," Proc. of SPIE, vol. 5962, pp. 59620Y-1 to 59620Y-8 (2005).
Complaint by Nikon Corporation dated Apr. 24, 2017, in *Nikon Corporation* vs. *Carl Zeiss SMT GmbH* in Germany re European Patent No. EP1881521 (171 pages).
Rejoinder by Carl Zeiss SMT GmbH dated Apr. 9, 2018 in *Nikon Corporation* vs. *Carl Zeiss SMT GmbH* in Germany re European Patent No. EP1881521 (45 pages).

(56) References Cited

OTHER PUBLICATIONS

Minutes of the Oral Hearing Proceedings in the European Patent Office (EPO) dated Mar. 31, 2017, in European Patent Application No, EP13174486.4 (7 pages).
Brief by Nikon Corporation dated Mar. 2, 2018, in *Carl Zeiss SMT GmbH* v. *Nikon Corporation* in Germany re European Patent No. EP1881521 (45 pages).

* cited by examiner

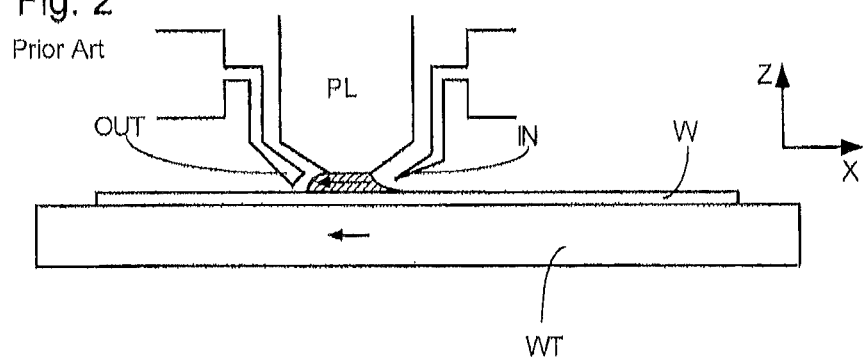
Fig. 2
Prior Art
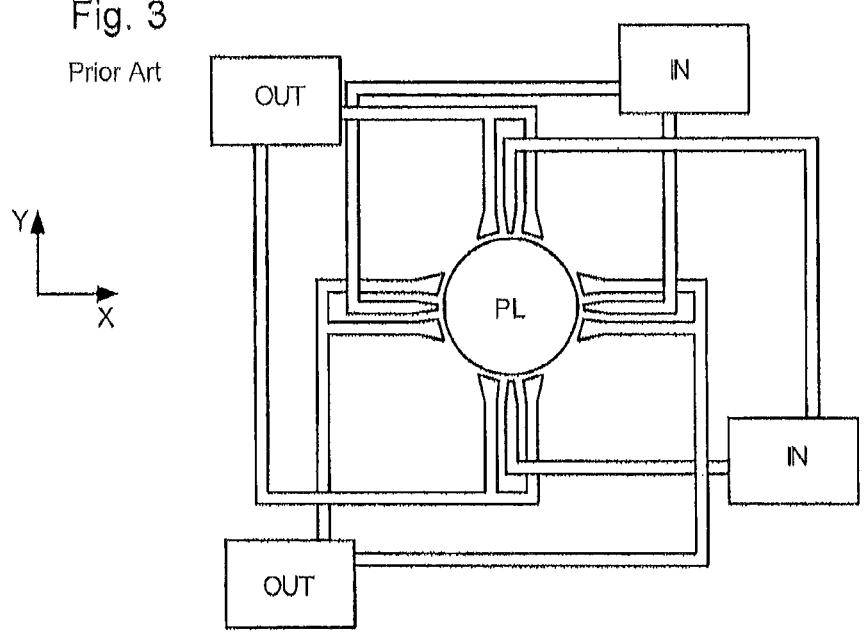
Fig. 3
Prior Art
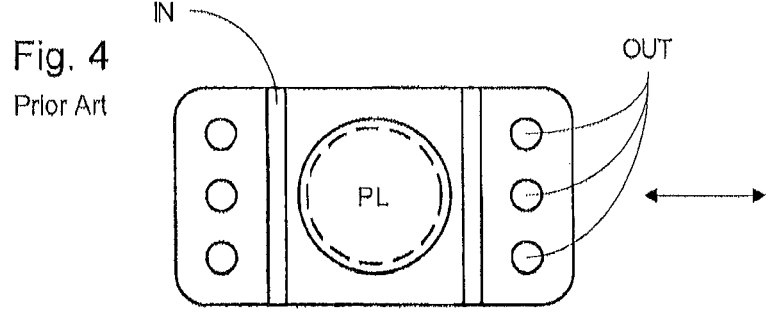
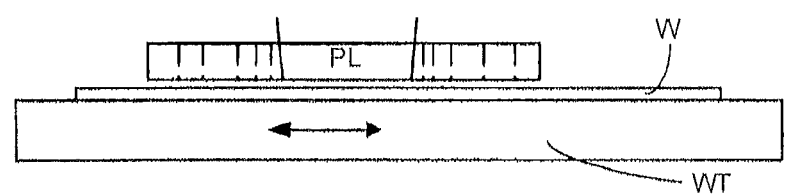
Fig. 4
Prior Art

LITHOGRAPHIC APPARATUS AND DEVICE MANUFACTURING METHOD

This application is a continuation application of co-pending U.S. patent application Ser. No. 14/484,076, filed Sep. 11, 2014, which is a continuation application of U.S. patent application Ser. No. 13/589,841, filed Aug. 20, 2012, now U.S. Pat. No. 8,860,924, which is a continuation application of U.S. patent application Ser. No. 11/120,186, filed May 3, 2005, now U.S. Pat. No. 8,248,577, the contents of each of the foregoing application is hereby incorporated in its entirety by reference.

FIELD

The invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate It has been proposed to immerse the substrate in the lithographic projection apparatus in a liquid having a relatively high refractive index, e.g. water, so as to fill a space between the final element (e.g., a lens, another optical element, or other structure) of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

The presence of bubbles in the immersion liquid of an immersion lithography apparatus may deleteriously affect the imaging quality and evaporation of immersion liquid from the substrate which can lead to overlay errors, problems with focus control and drying stains.

Accordingly, it would be advantageous, for example, to reduce bubble formation in and evaporation of the immersion liquid.

According to an aspect of the invention, there is provided a lithographic apparatus comprising:

a substrate table constructed to hold a substrate; and a projection system configured to project a patterned radiation beam onto a target portion of the substrate and having an element immediately adjacent the substrate, the element having a cross-sectional shape in a plane substantially parallel to the substrate which is rectilinear.

According to an aspect of the invention, there is provided a lithographic apparatus, comprising:

a substrate table constructed to hold a substrate;

a projection system configured to project a patterned radiation beam onto a target portion of the substrate; and a liquid confinement structure having a surface defining at least in part a space configured to contain liquid between the projection system and the substrate, wherein in a plane substantially parallel to the substrate, at a position closest to the substrate, the space has a cross-section which substantially conforms in shape, area, or both to that of the target portion.

According to an aspect of the invention, there is provided a lithographic apparatus, comprising:

a substrate table constructed to hold a substrate;

a projection system configured to project a patterned radiation beam onto a target portion of the substrate; and a liquid confinement structure having a surface defining at least in part a space configured to contain liquid between the substrate and an element of the projection system immediately adjacent the substrate, wherein in a plane substantially parallel to the substrate an area, a shape, or both of the cross-section of the element, of the space, or both, substantially conform(s) to that of the target portion.

According to an aspect of the invention, there is provided a device manufacturing method comprising using a projection system to project on a target portion of a substrate a patterned beam of radiation, wherein an element of the projection system immediately adjacent the substrate has a cross-sectional shape in a plane substantially parallel to the substrate which is rectilinear.

According to an aspect of the invention, there is provided a device manufacturing method comprising using a projection system to project on a target portion of a substrate a patterned beam of radiation, wherein a space configured to be filled with liquid between the projection system and the substrate is defined at least in part by a surface of a liquid confinement structure and wherein in a plane substantially parallel to the substrate at a position closest to the substrate the space has a cross-section which substantially conforms in shape, area, or both to that of the target portion.

According to an aspect of the invention, there is provided a device manufacturing method comprising using a projection system to project on a target portion of a substrate a patterned beam of radiation, wherein a liquid is provided in a space between the projection system and the substrate and which space is defined at least in part by a surface of a liquid confinement structure and the space, an element of the projection system immediately adjacent the substrate, or both, has a cross-section in a plane substantially parallel to the substrate which conforms closely in size, shape, or both to that of the target portion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
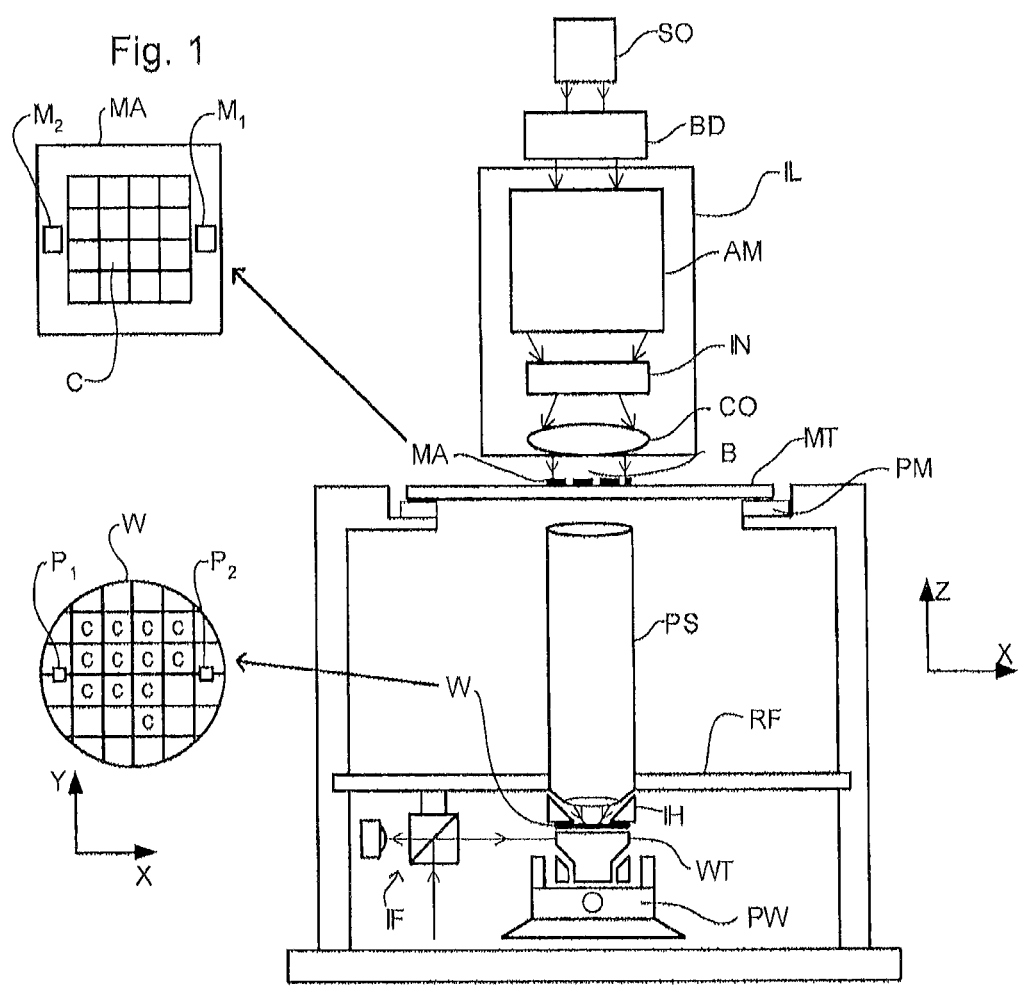
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
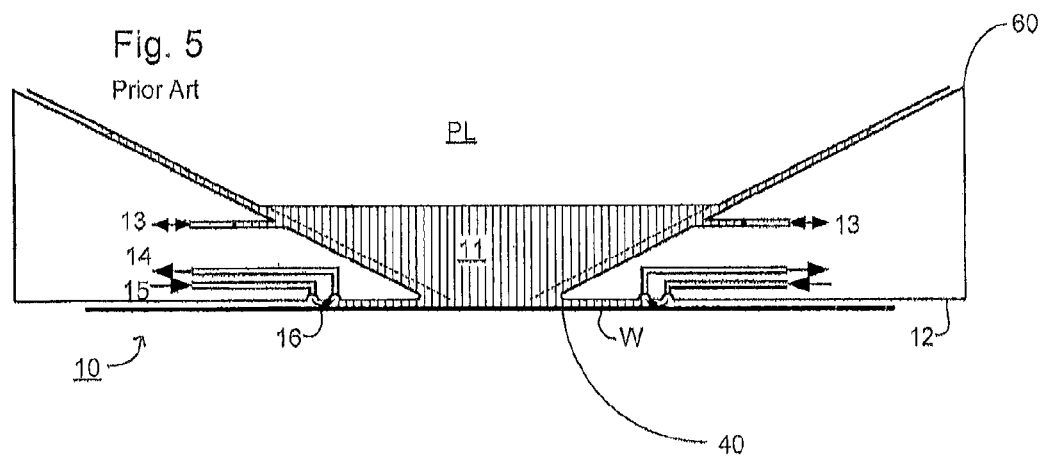
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. In an embodiment, the seal is a contactless seal such as a gas seal. Such a system is disclosed in United States patent application publication no. US 2004-0207824 and European patent application publication no. EP 1420298, each hereby incorporated in its entirety by reference, and illustrated in FIG. 5.

Figure 6:
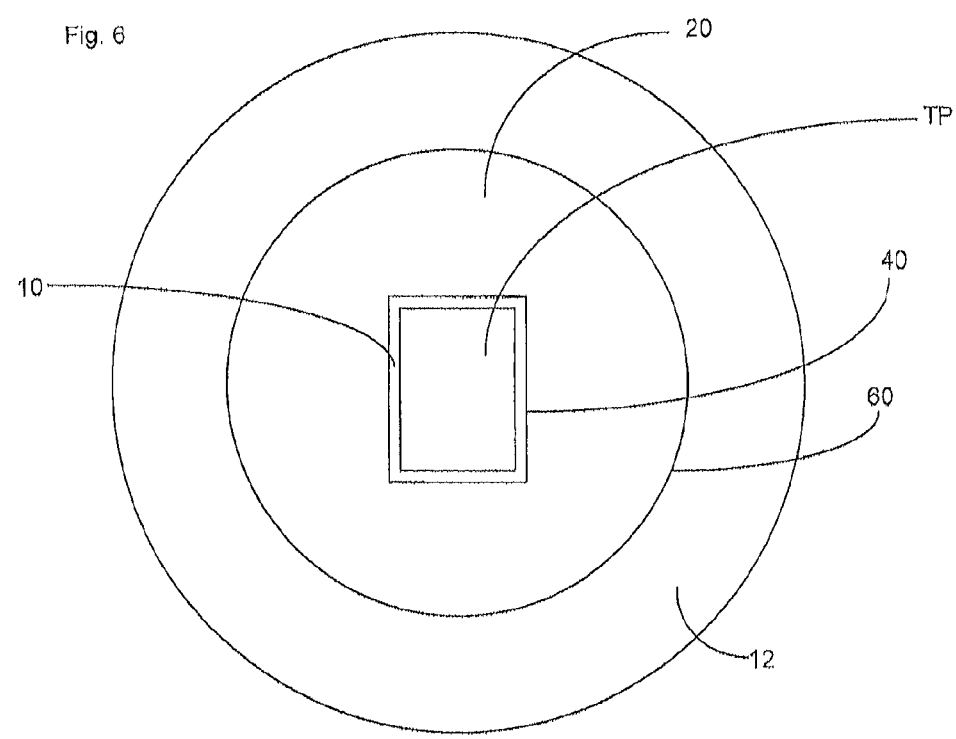
FIG. 6 depicts schematically in plan a space of a liquid confinement structure in accordance with an embodiment of the invention.
Figure 7:
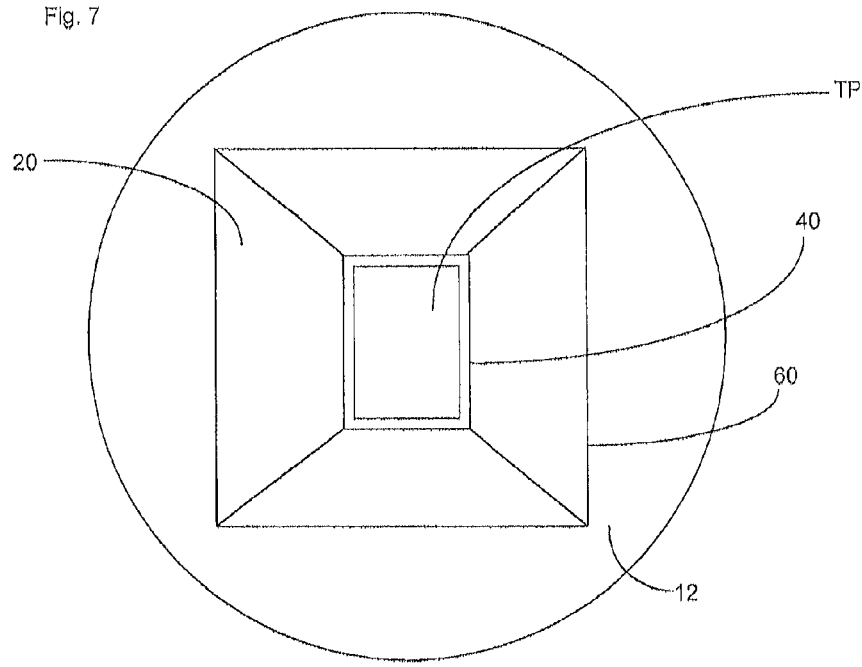
FIG. 7 depicts schematically in plan a space of another liquid confinement structure in accordance with an embodiment of the invention.
Figure 8:
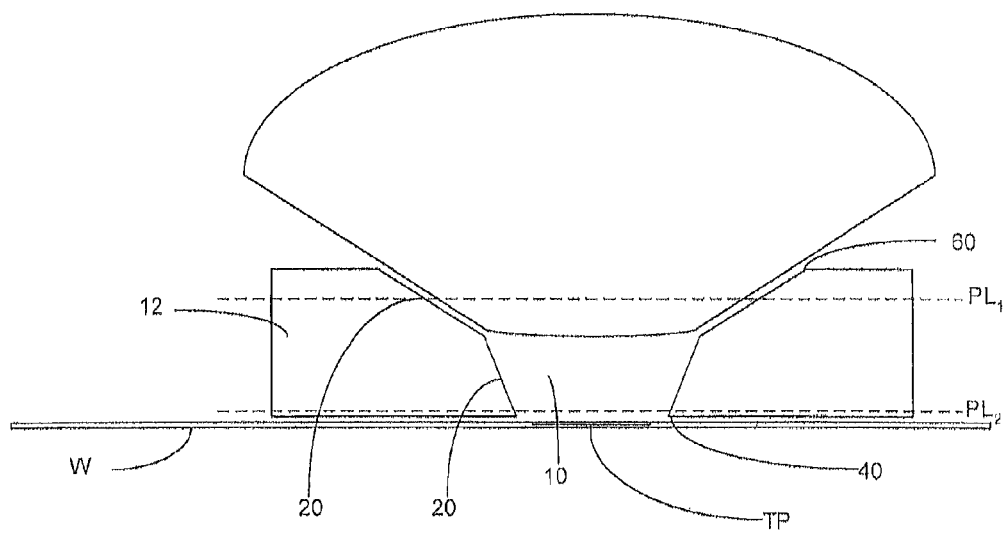
FIG. 8 depicts in cross-section a liquid confinement structure and a final element of the projection system according to the invention.
Figure 9:
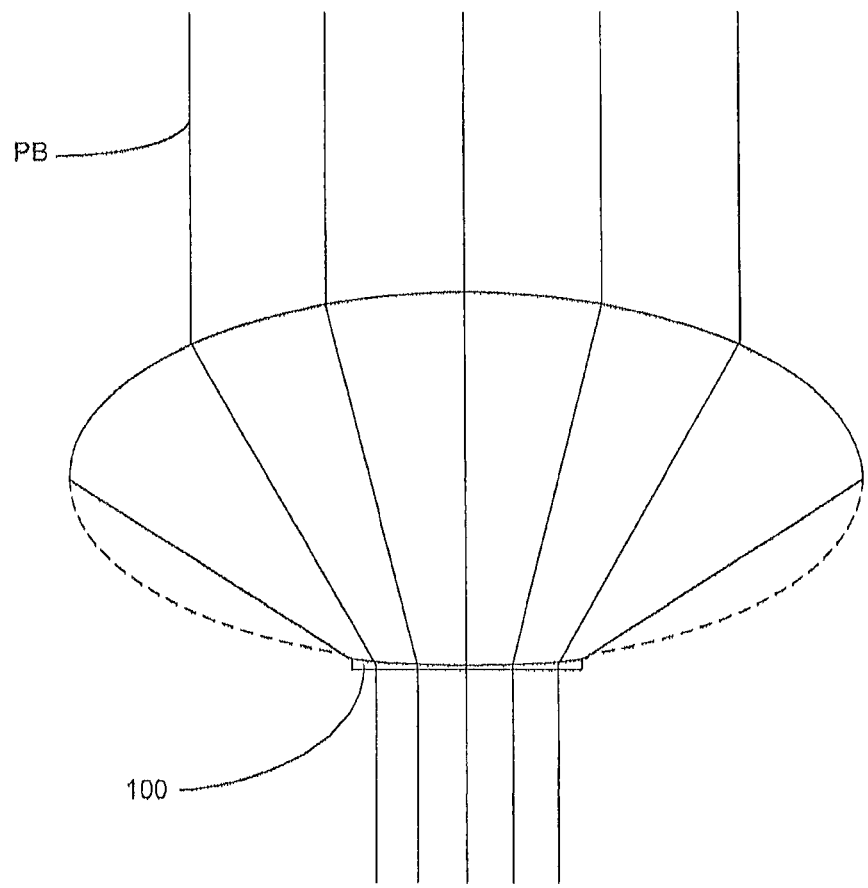
FIG. 9 depicts in cross-section a final element of the projection system.
Figure 10:
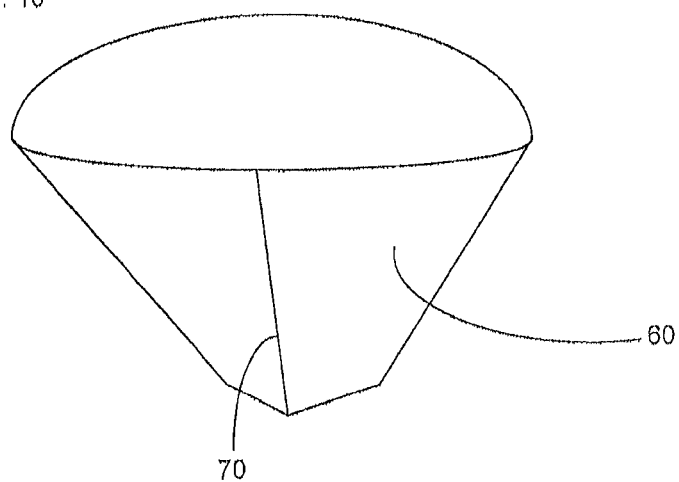
FIG. 10 depicts schematically the final element of FIG. 9.
Figure 11:
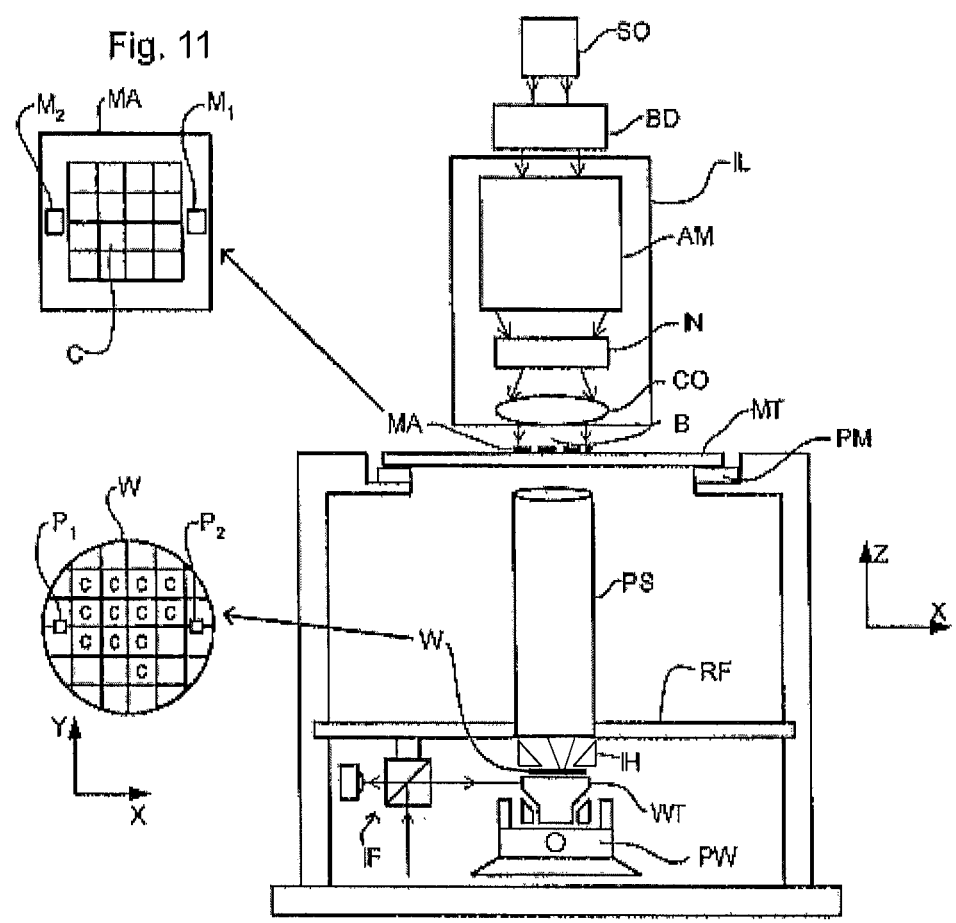
FIG. 11 depicts a lithographic apparatus according to an embodiment of the invention.

The size and shape of the target portion C (which is sometimes referred to as the slit size) can be determined by the illumination optics, such as a quartz rod which is a light mixer and/or a masking unit which is positioned near to the exit of this rod Bubbles may be formed in the immersion liquid due to movement of the substrate W and substrate table WT beneath the projection system PL and the substantially stationary liquid confinement system such as that illustrated in FIG. 4 or FIG. 5. In particular, when an edge of the substrate W passes under the space occupied by immersion liquid 11, bubbles may be formed in the immersion liquid and thereby reduce the imaging quality of the apparatus Liquid confinement systems have been typically designed for use with conventional projection systems PL. In such systems, the last element tends to have a circular cross-section in a plane substantially perpendicular to the optical axis of the projection system (which is the same as a plane substantially parallel to the substrate W). In order for the liquid confinement systems to operate, the cross-sectional area of the space filled with liquid closely conforms to the shape of the final element of the projection system in one and the same plane. This is designed to be the case to maximize the available space for the liquid supply system which requires many components in a small volume. Several different designs of liquid confinement system have been proposed. One or more embodiments of the invention are applicable to all of those different designs including but not limited to those disclosed in United States patent publication no. US 2004-0263809, PCT patent application publication no. WO 2004-090634, European patent application publication nos. EP 1420298, EP 1494079, and EP 1477856, and U.S. patent application Ser. No. 11/098,615, filed 5 Apr. 2005, the contents of each of which are incorporated in their entirety herein by reference The liquid confinement structure illustrated in FIG. 5 is now described in detail. However, one or more embodiments of the invention are not limited in application to this type of liquid confinement structure FIG. 5 shows a liquid reservoir or space 10 between the projection system and the substrate stage. The space 10 is filled with a liquid 11 having a relatively high refractive index, e.g. water, provided via inlet/outlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field A contactless seal to the substrate around the image field of the projection system is formal so that liquid is confined in the space 10 between the substrate surface and the final element of the projection system. The space is formed or defined by a liquid confinement structure 12 positioned below and surrounding the final element of the projection system PL. Liquid is brought into the space 10 below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the step of the projection system or the final element thereof and may, e.g., be round The liquid is confined in the space 10 by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid Other types of liquid confinement structure 12 may be used. For example, the gas seal may be replaced by a combination of a single phase extractor, a recess and a gas knife as is described in U.S. patent application Ser. No. 11/098,615, filed 5 Apr. 2005, hereby incorporated in its entirety by reference herein. Alternatively, a gas seal may be replaced by a hydrostatic or hydrodynamic bearing as is described in U.S. patent application publication no. US 2005-018155, each of which are hereby incorporated in their entirety by reference In order to reduce or minimize the amount of time which the space 10 occupied by liquid spends over an edge of the substrate W during scanning and to reduce or minimize the area of the top surface of the substrate from which immersion liquid may evaporate, the cross-section of the space 10 in a plane parallel to the top surface of the substrate W at a position closest to the substrate, is fashioned to conform closely to the shape of the target portion TP (sometimes referred to as the illumination slit area). This is illustrated in FIG. 6. As can be seen from FIG. 6, which is an illustration of the liquid confinement structure 12 in plan, the space 10 is defined by walls 20 extending between a lower opening 40 of the space 10 in the lower surface of the liquid confinement structure 12 and an upper opening 60 in the upper surface of the liquid confinement structure 12. In FIG. 6, the upper opening 60 is circular such that the liquid confinement structure 12 may be used with a conventional projection system PL in which the final element of the projection system is radially symmetric and the bottom opening 40 which is closest to the substrate W is rectangular and conforms in shape closely to the shape of the target portion TP. Furthermore, the lower opening 40 also closely conforms in size to that of the target portion TP though of course it cannot be smaller than the target portion TP. In an embodiment, the area of the lower opening 40 or of the cross-section of the space in a plane substantially parallel to the substrate W at a position closest to the substrate W is less than 1.5 times the area of the target portion TP, in an embodiment less than 1.4, 1.3, 1.2 or 1.1 times the area of the target portion TP. This difference is to account for relative movement of the liquid supply system to the final element either in the case of 'play' or so that the movement can be deliberately carried out The surface 20 of the liquid confinement structure 12 which defines the space 10 in which the liquid is confined is shaped to transfer smoothly from the shape of the upper opening 60 to the lower opening 40 and accommodates the shape of the final element of the projection system and allows some relative movement of the confinement system as is described in European patent application publication no. EP 1477856, the contents of which is hereby incorporated in its entirety by reference. However, such a transfer can result in difficulties in the flow conditions and so, in an embodiment, the shapes of the upper and lower openings, 40, 60 are similar, at least both rectilinear. This is particularly easy to arrange for if the projection system is close to the substrate. The further the projection system is from the substrate the more circular the projection system bottom needs to be because of the greater angles (there tend to be more pupil shapes). A rectilinear situation is illustrated in FIG. 7 in which the upper opening 60 is square and the lower opening 40 is rectangular. In this arrangement, it should be easy to achieve parallel flow of immersion liquid across the target portion TP without re-circulation of immersion liquid. Re-circulation of immersion liquid is to be avoided because re-circulated immersion liquid may be heated up by the projection beam PB more than non-re-circulated immersion liquid and the variation in temperature can lead to variations in refractive index of the immersion liquid in the space If the size of the lower opening 40 of the space in the liquid confinement structure 12 is reduced or minimized as is illustrated in FIGS. 6 and 7 by making its cross-sectional shape and/or size conform closely or be similar to that of the target portion TP, during scanning of a whole substrate W the number of scans in which the opening 40 passes over an edge of the substrate is greatly reduced. Thus, the opportunity for bubble formation in the immersion liquid in the space 10 due to passing over of the edge of the substrate is reduced and so is the area from which immersion liquid can evaporate FIGS. 8-10 illustrate an embodiment of the invention in which both the final element of the projection system and the liquid confinement structure 12 are optimized in shape and geometry so that the size of the lower opening 40 can be made to closely conform to the shape and/or size of the target portion TP without deleteriously affecting other operating conditions such as the ability to generate parallel flow of immersion liquid across the target portion TP or reducing the available volume for the liquid supply system. Indeed, this embodiment may increase available volume for the liquid supply system over prior systems In FIG. 8, a liquid confinement structure 12 similar to that illustrated in FIG. 7 is used. Thus, the lower opening 40 of the space is of a similar shape and dimension to the target portion TP in a plane $PL_2$ which is substantially parallel to the substrate W and adjacent the substrate W, e.g., at a position closest to the substrate W. As is illustrated, the liquid confinement structure 12 partly surrounds the final element of the projection system PL. Thus, a plane $PL_1$ exists which is substantially parallel to the plane of the top surface of the substrate W and also intersects both the space 10 defined by the liquid confinement structure 12 and the lower end of the final element of the projection system PL. In this plane, the cross-sectional shape and size of the space is similar to that of the cross-sectional shape and size of the final element of the projection system PL. Thus, in contrast to the final element of the projection system which would be used with the liquid confinement structure 12 of FIG. 6, the final element of the projection system PL is shaped such that it also has a rectangular or square cross-section in that plane so that it is possible for the inner surface of the liquid confinement structure 12 which defines the space to transfer in shape from the lower opening 40 to the upper opening 60 without needing to convert straight lines to curved lines. This helps in the establishment of parallel flow of immersion liquid across the target portion TP and simplifies the shaping of walls 20. As the distance between the projection system and the substrate increases, the importance of a homogeneous immersion liquid increases so that parallel flow is even more desirable. The walls 20 are all substantially flat. In an embodiment, the shape of the lower opening and upper opening, and thereby the shape of the cross-section of the final element of the projection system PL, are similar to the shape of the target portion In FIG. 8, a space 10 is illustrated which has a cross-section in a plane substantially parallel to the substrate W which decreases as the substrate W is approached. This need not necessarily be the case and it may be that the upper and lower openings 40, 60 are the same or substantially the same size so that the side walls of the space defined by the liquid confinement structure 12 are parallel in cross-section. As is illustrated in FIG. 8, the rate of increase/decrease in cross-sectional area as the substrate W is left/approached is not necessarily constant and a space 10 with two gradients of inner side wall 20 is provided, a steep gradient between the substrate 20 and substantially the bottom of the projection system and another shallower gradient above that FIG. 9 illustrates a final element of the projection system. The dotted lines show the shape of a typical final element of a projection system and it can be seen that those parts of the final element can be removed without affecting the optical properties of the final element in use. Machining away the areas shown in dotted lines is one way of manufacturing such an element. Thus, the bottom surface of the final element is a shape to which the space of the liquid confinement structure 12 can be closely formed without the need to use a curved upper opening 60. The very bottom of the final element is illustrated as having a coating 100 applied to it (or a quartz plate or so-called abslussplatte 100). The coating or quartz plate 100 is shown as being flat. However, this need not be the case and the very bottom surface of the final element may be curved and may or may not have a coating or quartz plate applied to it FIG. 10 is a three dimensional illustration of the final element of the projection system in which the transition from a curved upper surface to a non-curved lower surface is clearly seen. The top half of the element is normally shaped and it is the bottom half of the element which has flat sides joined by straight edges 70 i.e. has a rectilinear cross-sectional shape in a plane substantially parallel to the substrate W An embodiment of the invention is also applicable to off axis projection systems in which projection bean is arranged such that the target portion is not, in plan, centered under the middle of the projection system. An example embodiment of this arrangement is depict in FIG. 11.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

In an embodiment, there is provided a lithographic apparatus comprising: a substrate table constructed to hold a substrate; and a projection system configured to project a patterned radiation beam onto a target portion of the substrate and having an element immediately adjacent the substrate, the element having a cross-sectional shape in a plane substantially parallel to the substrate which is rectilinear.

In an embodiment, the cross-sectional shape is similar to the shape of the target portion. In an embodiment, a bottom surface closest to the substrate of the element is curved. In an embodiment, the target portion is substantially rectangular. In an embodiment, the cross-sectional shape of the element in a plane substantially parallel to the substrate has an area which is less than 1.5 times the area of the target portion. In an embodiment, the apparatus further comprises a liquid confinement structure having a surface at least in part defining a space configured to contain a liquid between the projection system and the substrate, wherein in a plane substantially parallel to the substrate the space has a cross-section which substantially conforms in shape to the shape of the target portion. In an embodiment, the cross-section of the space has an area which is less than 1.5 times the area of the target portion. In an embodiment, the surface of the liquid confinement structure extends beyond a bottom surface closest to the substrate of the element, and, in a plane which intersects both the space and the element and which is substantially parallel to the substrate, the cross-sectional shapes and areas of the space and element closely conform.

In an embodiment, there is provided a lithographic apparatus, comprising: a substrate table constructed to hold a substrate; a projection system configured to project a patterned radiation beam onto a target portion of the substrate; and a liquid confinement structure having a surface at least in part defining a space configured to contain liquid between the projection system and the substrate, wherein in a plane substantially parallel to the substrate, at a position closest to the substrate, the space has a cross-section which substantially conforms in shape, area, or both to that of the target portion.

In an embodiment, the cross-section of the space has an area which is less than 1.5 times the area of the target portion. In an embodiment, in a plane substantially parallel to the substrate and which intersects both the space and a final element of the projection system, the periphery of the cross-section of the final element is substantially evenly surrounded by the periphery of the cross-section of the space. In an embodiment, a final element of the projection system has a cross-section in a plane substantially parallel to the substrate which substantially conforms in shape to the shape of the target portion, the cross-section of the space, or both. In an embodiment, the target portion is substantially rectangular.

In an embodiment, there is provided a lithographic apparatus, comprising: a substrate table constructed to hold a substrate; a projection system configured to project a patterned radiation beam onto a target portion of the substrate; and a liquid confinement structure having a surface at least in part defining a space configured to contain liquid between the substrate and an element of the projection system immediately adjacent the substrate, wherein in a plane substantially parallel to the substrate an area, a shape, or both of the cross-section of the element, of the space, or both, substantially conform(s) to that of the target portion.

In an embodiment, the space is tapered such that the cross-sectional area of the space in a plane substantially parallel to the substrate reduces as the substrate is approached. In an embodiment, the cross-sectional shape of the space in a plane substantially parallel to the substrate changes from a position furthest from the substrate to a position closest to the substrate, wherein at the position closest to the substrate the cross-sectional shape is substantially the same as the shape of the target portion.

In an embodiment, there is provided a device manufacturing method comprising using a projection system to project on a target portion of a substrate a patterned beam of radiation, wherein an element of the projection system immediately adjacent the substrate has a cross-sectional shape in a plane substantially parallel to the substrate which is rectilinear.

In an embodiment, there is provided a device manufacturing method comprising using a projection system to project on a target portion of a substrate a patterned beam of radiation, wherein a space configured to be filled with liquid between the projection system and the substrate is defined at least in part by a surface of a liquid confinement structure and wherein in a plane substantially parallel to the substrate at a position closest to the substrate the space has a cross-section which substantially conforms in shape, area, or both to that of the target portion.

In an embodiment, there is provided a device manufacturing method comprising using a projection system to project on a target portion of a substrate a patterned beam of radiation, wherein a liquid is provided in a space between the projection system and the substrate and which space is defined at least in part by a surface of a liquid confinement structure and the space, an element of the projection system immediately adjacent the substrate, or both, has a cross-section in a plane substantially parallel to the substrate which conforms closely in size, shape, or both to that of the target portion.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a substrate table constructed to hold a substrate;
a projection system configured to project a patterned radiation beam onto a target portion of the substrate, the target portion not centered under the middle of the projection system; and
a liquid confinement structure having a surface at least in part defining a space configured to contain liquid between the substrate and an optical element of the projection system immediately adjacent the substrate,
wherein a lower end of the optical element has a cross-section that substantially conforms to the target portion that is not centered under the middle of the projection system, and
wherein the bottom surface of the optical element protrudes towards the substrate relative to an upper portion of the optical element.

2. The apparatus according to claim 1, wherein the optical element is tapered such that the cross-sectional area of the optical element in a plane essentially parallel to the substrate reduces as the substrate is approached.

3. The apparatus according to claim 1, wherein the cross-sectional shape of the optical element in a plane essentially parallel to the substrate changes from a position furthest from the substrate to a position closest to the substrate, wherein at the position closest to the substrate the cross-sectional shape is substantially the same as the shape of the target portion.

4. A device manufacturing method comprising using the lithographic apparatus according to claim 1 to project on a target portion of a substrate a patterned beam of radiation.

5. The lithographic apparatus according to claim 1, wherein the projection system is an off-axis projection system having the target portion decentered from an optical axis of the projection system.

6. The lithographic apparatus according to claim 5, wherein the lower end of the optical element is decentered from the optical axis of the projection system.

7. The lithographic apparatus according to claim 1, wherein the projection system is an off-axis, catadioptric projection system.

8. The lithographic apparatus according to claim 1, wherein the target portion is essentially rectangular.

9. A projection system configured to project a patterned radiation beam onto a target portion of a substrate through a liquid, the projection system comprising:
an optical element immediately adjacent the substrate,
wherein a bottom surface of the optical element adjacent the substrate has a cross-sectional shape that substantially conforms in shape to the shape of the target portion,
wherein the target portion is not, in plan, centered under the middle of the projection system, and
wherein the bottom surface of the optical element protrudes towards the substrate relative to an upper portion of the optical element.

10. The projection system according to claim 9, wherein the projection system is an off-axis projection system.

11. The projection system according to claim 10, wherein the off-axis projection system has the target portion decentered from an optical axis of the projection system.

12. The projection system according to claim 11, wherein the bottom surface is decentered from the optical axis of the projection system.

13. The projection system according to claim 9, wherein the bottom surface has a rectilinear shape.

14. The projection system according to claim 13, wherein the bottom surface has a rectangular shape.

15. The projection system according to claim 9, wherein the projection system is configured to project the patterned radiation beam onto the target portion with demagnification.

16. The projection system according to claim 9, wherein the projection system is an off-axis, catadioptric projection system.

17. The projection system according to claim 9, wherein the bottom surface is flat.

18. The projection system according to claim 9, wherein the optical element is tapered such that the cross-sectional area of the optical element in a plane substantially parallel to the substrate reduces as the substrate is approached.

19. A lithographic apparatus comprising:
the projection system according to claim 9 to project a patterned radiation beam onto a target portion of a substrate, wherein the patterned radiation beam is based on illumination light from an illumination system.

20. The lithographic apparatus according to claim 19, configured to project the patterned radiation beam onto the target portion while the position of the substrate is scanned.

21. The lithographic apparatus according to claim 19 further comprising:
a localized liquid supply system configured to provide the liquid.

22. A device manufacturing method comprising:
using the projection system according to claim 9 to project on a target portion of a substrate a patterned beam of radiation to expose a resist on the substrate; and
developing the exposed resist.

23. The device manufacturing method according to claim 22, wherein the patterned radiation beam is projected onto the target portion while the position of the substrate is scanned.

24. A projection system configured to project a patterned radiation beam onto a target portion of a substrate through a liquid, the projection system comprising:
   an optical element immediately adjacent the substrate,
   wherein a bottom surface of the optical element adjacent the substrate has a cross-sectional shape that substantially conforms in shape to the shape of the target portion,
   wherein the projection system is an off-axis projection system having the target portion not, in plan, centered under the middle of the projection system,
   wherein the bottom surface of the optical element is decentered from an optical axis of the projection system,
   wherein the projection system is a catadioptric projection system, and
   wherein the bottom surface of the optical element protrudes towards the substrate relative to an upper portion of the optical element.

25. The projection system according to claim 24, wherein the bottom surface has a rectilinear shape.

26. The projection system according to claim 24, wherein the optical element is tapered such that the cross-sectional area of the optical element in a plane essentially parallel to the substrate reduces as the substrate is approached.

27. The projection system according to claim 24, wherein the optical element comprises tapered side surfaces extending from the upper portion of the optical element to the bottom surface of the optical element.

28. The projection system according to claim 27, wherein the optical element has a cross-sectional area parallel to the substrate that reduces as the substrate is approached.

29. The projection system according to claim 28, wherein the bottom surface has a rectilinear shape.

30. The projection system according to claim 28, wherein the bottom surface is planar.

31. An exposure apparatus comprising:
   the projection system according to claim 24 for projecting an image of a predetermined pattern onto a photosensitive substrate that is set on the second plane based on illumination light from the pattern set on the first plane; and
   a supply and discharge mechanism for supplying and discharging the liquid.

32. The exposure apparatus according to claim 31, wherein the pattern is projected while changing a positional relationship of the image of the pattern and the photosensitive substrate in a scanning direction.

33. A device manufacturing method comprising:
   an exposure step of projecting and exposing an image of a pattern set on the first plane onto a photosensitive substrate set on the second plane with the projection system according to claim 24; and
   a development step of developing the photosensitive substrate that has undergone the exposure step.

34. A projection system configured to project a patterned radiation beam onto a target portion of a substrate through a liquid, the projection system comprising:
   an optical element immediately adjacent the substrate and contacting the liquid,
   wherein a bottom surface of the optical element adjacent the substrate has a cross-sectional shape that substantially conforms in shape to the shape of the target portion,
   wherein the projection system has the target portion not, in plan, centered under the middle of the projection system,
   wherein the bottom surface of the optical element is decentered from the optical axis of the projection system, and
   wherein the bottom surface of the optical element protrudes towards the substrate relative to an upper portion of the optical element.

35. The projection system according to claim 34, wherein the bottom surface has a rectilinear shape.

36. The projection system according to claim 34, wherein the optical element is tapered such that the cross-sectional area of the optical element in a plane essentially parallel to the substrate reduces as the substrate is approached.

37. The projection system according to claim 34, wherein the optical element comprises tapered side surfaces extending from the upper portion of the optical element to the protruding bottom surface of the optical element.

38. The projection system according to claim 37, wherein the optical element has a cross-sectional area parallel to the substrate that reduces as the substrate is approached.

39. The projection system according to claim 34, wherein a periphery of the upper portion of the optical element surrounds the protruding bottom surface from above.

40. The projection system according to claim 34, wherein the projection system is a catadioptric projection system.

41. The projection system according to claim 34, wherein the projection system projects the patterned radiation beam onto the target portion with demagnification.

42. An exposure apparatus comprising:
   the projection system according to claim 34 for projecting an image of a predetermined pattern onto a photosensitive substrate that is set on the second plane based on illumination light from the pattern set on the first plane; and
   a supply and discharge mechanism for supplying and discharging the liquid.

43. The exposure apparatus according to claim 42, wherein the pattern is projected while changing a positional relationship of the image of the pattern and the photosensitive substrate in a scanning direction.

44. A device manufacturing method comprising:
   an exposure step of projecting and exposing an image of a pattern set on the first plane onto a photosensitive substrate set on the second plane with the projection system according to claim 34; and
   a development step of developing the photosensitive substrate that has undergone the exposure step.

45. A lithographic apparatus comprising:
   a substrate table constructed to hold a substrate;
   a projection system configured to project a patterned radiation beam onto a target portion of the substrate through a liquid in a direction of an optical axis;
   a positioner coupled to the substrate table and configured to scan the substrate relative to the patterned radiation along a direction perpendicular to the optical axis;
   wherein the projection system comprises an optical element immediately adjacent the substrate and contacting the liquid, wherein a bottom surface of the optical element adjacent the substrate has a cross-sectional shape that substantially conforms in shape to the shape of the target portion, wherein the projection system is an off-axis projection system having the target portion not, in plan, centered under the middle of the projection system, wherein the bottom surface of the optical element is decentered from the optical axis of the projection system, and wherein the bottom surface of the optical element protrudes towards the substrate relative to an upper portion of the optical element.

46. The lithographic apparatus according to claim 45, wherein the bottom surface has a rectilinear shape.

47. The lithographic apparatus according to claim 45, wherein the optical element is tapered such that the cross-sectional area of the optical element in a plane essentially parallel to the substrate reduces as the substrate is approached.

48. The lithographic apparatus according to claim 45, wherein the optical element comprises tapered side surfaces extending from the upper portion of the optical element to the protruding bottom surface of the optical element.

49. The lithographic apparatus according to claim 48, wherein the optical element has a cross-sectional area parallel to the substrate that reduces as the substrate is approached.

50. The lithographic apparatus according to claim 45, wherein a periphery of the upper portion of the optical surrounds the protruding bottom surface from above.

51. The lithographic apparatus according to claim 45, wherein the off-axis projection system is a catadioptric, off-axis projection system.

52. The lithographic apparatus according to claim 45, wherein the projection system projects the patterned radiation beam onto the target portion with demagnification.

53. A lithographic apparatus comprising:
a substrate table constructed to hold a substrate;
a projection system configured to project a patterned radiation beam onto a target portion of the substrate through a liquid;
a positioner coupled to the substrate table and configured to scan the substrate relative to the patterned radiation along a direction perpendicular to an optical axis of the projection system;
wherein the projection system comprises an optical element immediately adjacent the substrate and having a bottom surface adjacent the substrate that is arranged to contact the liquid,
wherein the target portion is not centered under the middle of the projection system,
wherein the bottom surface of the optical element is decentered from the optical axis of the projection system, and
wherein the bottom surface of the optical element is formed in a lower portion of the optical element that protrudes towards the substrate relative to an upper portion of the optical element.

54. The lithographic apparatus according to claim 53, wherein the bottom surface has a rectilinear shape.

55. The lithographic apparatus according to claim 53, further comprising a downward-facing surface located above the bottom surface.

56. The lithographic apparatus according to claim 55, wherein the optical element has a surface which extends upwardly and radially from the bottom surface.

57. The lithographic apparatus according to claim 56, wherein the surface which extends upwardly and radially from the bottom surface is located between the bottom surface and the downward-facing surface.

58. The lithographic apparatus according to claim 53, wherein the optical element is tapered such that a cross-sectional area of at least part of the optical element in a plane essentially parallel to the substrate reduces as the substrate is approached.

59. The lithographic apparatus according to claim 53, wherein a periphery of the upper portion of the optical element surrounds the lower surface from above.

60. The lithographic apparatus according to claim 53, wherein the projection system is an off-axis, catadioptric projection system.

61. The lithographic apparatus according to claim 53, wherein the refractive optical element is arranged so that a center of a light entering surface of the optical element is substantially centered with the optical axis.

62. The lithographic apparatus according to claim 53, wherein a width of the protruding portion with respect to a first direction is narrower than a width of the protruding portion with respect to a second direction perpendicular to the optical axis and the first direction.

63. The lithographic apparatus according to claim 53, wherein the bottom surface crosses the optical axis.

64. A projection system configured to project a patterned radiation beam onto a target portion of a substrate through a liquid, the projection system comprising:
an optical element immediately adjacent the substrate and having a bottom surface arranged to contact the liquid,
wherein the target portion is not centered under the middle of the projection system,
wherein the bottom surface of the optical element is decentered from an optical axis of the projection system, and
wherein the bottom surface of the optical element is formed in a lower portion of the optical element that protrudes towards the substrate relative to an upper portion of the optical element.

65. The lithographic apparatus according to claim 64, wherein the bottom surface has a rectilinear shape.

66. The lithographic apparatus according to claim 64, further comprising a downward-facing surface located above the bottom surface.

67. The lithographic apparatus according to claim 66, wherein the optical element has a surface which extends upwardly and radially from the bottom surface.

68. The lithographic apparatus according to claim 67, wherein the surface which extends upwardly and radially from the bottom surface is located between the bottom surface and the downward-facing surface.

69. The lithographic apparatus according to claim 64, wherein the optical element is tapered such that a cross-sectional area of at least part of the optical element in a plane essentially parallel to the substrate reduces as the substrate is approached.

70. The lithographic apparatus according to claim 64, wherein a periphery of the upper portion of the optical element surrounds the lower surface from above.

71. The lithographic apparatus according to claim 64, wherein the projection system is an off-axis, catadioptric projection system.

72. The lithographic apparatus according to claim 64, wherein the refractive optical element is arranged so that a center of a light entering surface of the optical element is substantially centered with the optical axis.

73. The lithographic apparatus according to claim 64, wherein a width of the protruding portion with respect to a first direction is narrower than a width of the protruding portion with respect to a second direction perpendicular to the optical axis and the first direction.

74. The lithographic apparatus according to claim 64, wherein the bottom surface crosses the optical axis.

* * * * *

UNITED STATES PATENT AND TRADEMARK OFFICE
CERTIFICATE OF CORRECTION

PATENT NO. : 10,451,973 B2
APPLICATION NO. : 14/871795
DATED : October 22, 2019
INVENTOR(S) : Bob Streefkerk et al.

Page 1 of 1

It is certified that error appears in the above-identified patent and that said Letters Patent is hereby corrected as shown below:

On the Title Page

On page 2, item [56]:

Correct "2005/0024009, 02/2005, De Smit, et al." to "2005/0024609, 02/2005, De Smit, et al."

Insert reference --Reply filed January 12, 2018 in Nikon Corporation vs. Carl Zeiss SMT GmbH, EP Patent No. 1881521 (68 pages)-- in the Other Publications Signed and Sealed this
Third Day of December, 2019

Andrei Iancu
*Director of the United States Patent and Trademark Office*